United States Patent
Huang et al.

(10) Patent No.: US 8,405,228 B2
(45) Date of Patent: Mar. 26, 2013

(54) INTEGRATED CIRCUIT PACKAGING SYSTEM WITH PACKAGE UNDERFILL AND METHOD OF MANUFACTURE THEREOF

(75) Inventors: Rui Huang, Singapore (SG); Heap Hoe Kuan, Singapore (SG); Yaojian Lin, Singapore (SG); Seng Guan Chow, Singapore (SG)

(73) Assignee: STATS Chippac Ltd., Singapore (SG)

( * ) Notice: Subject to any disclaimer, the term of this patent is extended or adjusted under 35 U.S.C. 154(b) by 353 days.

(21) Appl. No.: 12/411,154

(22) Filed: Mar. 25, 2009

(65) Prior Publication Data

US 2010/0244277 A1  Sep. 30, 2010

(51) Int. Cl.
*H01L 23/31* (2006.01)
(52) U.S. Cl. ........... 257/778; 257/790; 257/E33.059; 257/E23.126
(58) Field of Classification Search .......... 257/698, 257/730, 778, 790, E23.057, E33.059, E23.011, 257/E23.067, E23.126
See application file for complete search history.

(56) References Cited

U.S. PATENT DOCUMENTS

| | | | |
|---|---|---|---|
| 6,404,062 B1 | 6/2002 | Taniguchi et al. | |
| 6,756,251 B2 | 6/2004 | Lee | |
| 7,087,994 B2 | 8/2006 | Lee | |
| 7,256,066 B2 * | 8/2007 | Chen et al. | 438/106 |
| 7,429,521 B2 | 9/2008 | Myers | |
| 7,482,201 B2 | 1/2009 | Charles et al. | |
| 7,485,502 B2 | 2/2009 | Jeon et al. | |
| 2008/0038870 A1 | 2/2008 | Gupta et al. | |
| 2008/0048343 A1 * | 2/2008 | Grigg et al. | 257/778 |
| 2008/0211111 A1 | 9/2008 | Park et al. | |
| 2008/0246163 A1 * | 10/2008 | Tanida et al. | 257/778 |
| 2008/0261350 A1 * | 10/2008 | Daves et al. | 438/106 |
| 2009/0057928 A1 | 3/2009 | Zhai et al. | |
| 2009/0230409 A1 * | 9/2009 | Basin et al. | 257/88 |

* cited by examiner

*Primary Examiner* — George Fourson, III
(74) *Attorney, Agent, or Firm* — Ishimaru & Associates LLP; John Yang (57) ABSTRACT

A method of manufacture of an integrated circuit packaging system includes: providing a sacrificial carrier assembly having a stack interconnector thereover; mounting an integrated circuit having a connector over the sacrificial carrier assembly with the connector over the stack interconnector; dispensing an underfill material between the sacrificial carrier assembly and the integrated circuit with the underfill material substantially free of a void; encapsulating the integrated circuit over the sacrificial carrier assembly and the underfill material; exposing the stack interconnector by removing the sacrificial carrier assembly; and forming a base array over the underfill material and the stack interconnector.

9 Claims, 7 Drawing Sheets

INTEGRATED CIRCUIT PACKAGING SYSTEM WITH PACKAGE UNDERFILL AND METHOD OF MANUFACTURE THEREOF

TECHNICAL FIELD

The present invention relates generally to an integrated circuit packaging system, and more particularly to a stackable packaging system with underfill.

BACKGROUND ART

The integrated circuit package is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages using electrical connections.

Products must compete in world markets and attract many consumers or buyers in order to be successful. It is very important for products to continue to improve in features, performance, and reliability while reducing product costs, product size, and equally important to be available quickly for purchase by the consumers or buyers.

Time to market, reliability, and the amount of circuitry and the amount of electrical connections inside a product are key to improving the features, performance, and reliability of any product. Furthermore, the ways the circuitry and electrical connections are implemented have a direct impact on the availability, reliability, and costs of products.

Attempts have failed to provide a complete solution addressing simplified manufacturing processing, time to market, reliability, and costs with smaller dimensions, lower costs due to design flexibility, increased functionality, leveragability, and increased IO connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a sacrificial carrier assembly having a stack interconnector thereover; mounting an integrated circuit having a connector over the sacrificial carrier assembly with the connector over the stack interconnector; dispensing an underfill material between the sacrificial carrier assembly and the integrated circuit with the underfill material substantially free of a void; encapsulating the integrated circuit over the sacrificial carrier assembly and the underfill material; exposing the stack interconnector by removing the sacrificial carrier assembly; and forming a base array over the underfill material and the stack interconnector.

The present invention provides an integrated circuit packaging system including: a stack interconnector; an integrated circuit having a connector over the stack interconnector; a base, having a first side and a second side, attached to the stack interconnector with the first side facing the stack interconnector; an underfill substantially free of a void between the base and the integrated circuit; an encapsulation over the integrated circuit; and a system interconnector attached to the second side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane of the substrate. The term "on" means that there is direct contact among elements.

The term "processing" as used herein includes deposition of material or photoresist, patterning, exposure, development, etching, cleaning, and/or removal of the material or photoresist as required in forming a described structure.

Figure 1:
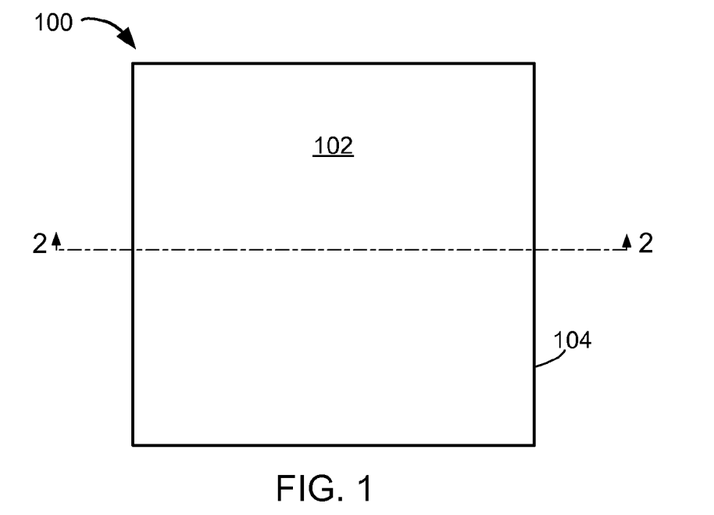
FIG. 1 is a top view of an integrated circuit packaging system in a first embodiment of the present invention.

Referring now to FIG. 1, therein is shown a top view of an integrated circuit packaging system 100 in a first embodiment of the present invention. The top view depicts an encapsulation 102, such as an enclosure formed from an epoxy molding compound, used to protect the contents of the integrated circuit packaging system 100.

For purposes of illustration, the encapsulation 102 of the integrated circuit packaging system 100 is shown having encapsulation non-horizontal sides 104 forming a rectangular footprint shape, although it is understood that the integrated circuit packaging system 100 can have a different footprint shape. For example, footprint shape of the encapsulation 102 of the integrated circuit packaging system 100 could have any polygon footprint shape.

Figure 2:
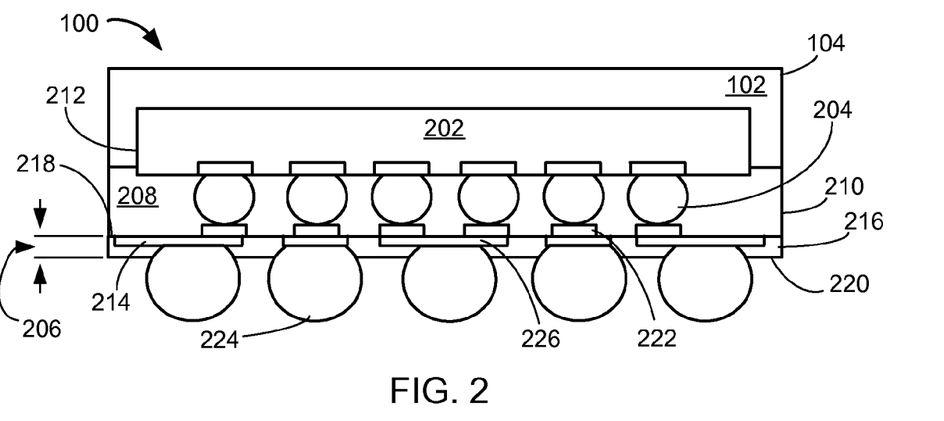
FIG. 2 is a cross-sectional view of the integrated circuit packaging system of the present invention taken along a line 2-2 of FIG. 1.

Referring now to FIG. 2, therein is shown a cross-sectional view of the integrated circuit packaging system 100 of the present invention taken along a line 2-2 of FIG. 1. The integrated circuit packaging system 100 can preferably include an integrated circuit 202, such as a flip chip, an integrated circuit die, or integrated circuit device, with connectors 204, such as solder balls, stud bumps, copper pillars, copper bars, or combinations thereof, mounted over a base 206, such as a non-laminated redistribution structure.

The integrated circuit 202 can be covered with the encapsulation 102. An underfill 208 can be formed of a material having specific coefficient of thermal expansion (CTE) characteristics and used to compensate for any thermal expansion mismatch between the integrated circuit 202, the encapsulation 102, and the base 206. The connectors 204 can provide a stress buffering layer between the integrated circuit 202 and the base 206. The underfill 208 can preferably be between the integrated circuit 202 and the base 206 surrounding the connectors 204.

The underfill 208 can surround the connectors 204 between the integrated circuit 202 and the base 206 to provide protection from moisture or contamination. The underfill 208 can also provide protection from thermal and physical related stress to the connectors 204, the integrated circuit 202, and the base 206.

Underfill non-horizontal sides 210 of the underfill 208, can be exposed from the encapsulation 102. The underfill non-horizontal sides 210 can preferably be coplanar with the encapsulation non-horizontal sides 104.

A side of the underfill 208 facing the integrated circuit 202 can be in direct physical contact with the integrated circuit 202 and the encapsulation 102. A side of the underfill 208 opposite the side facing the integrated circuit 202 can be in direct physical contact with the base 206. The underfill 208 can cover areas of the edges 212 of the integrated circuit 202 and completely cover a first side 218 of the base 206. The first side 218 faces the integrated circuit 202. The integrated circuit 202 can be partially within the underfill 208.

Figure 6:
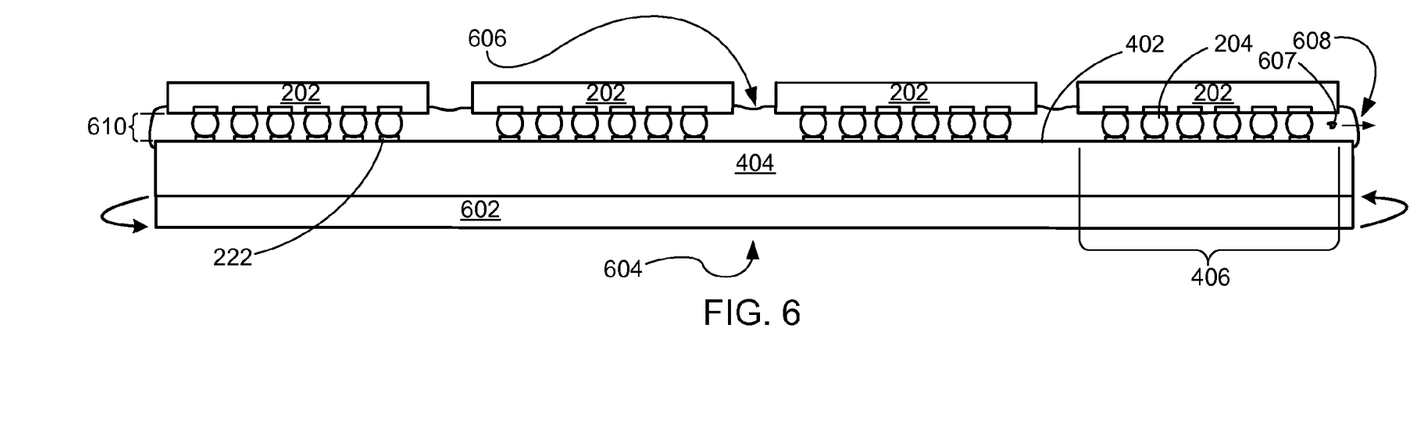
FIG. 6 is the structure of FIG. 5 in a dispensing and curing phase of an underfill material.

The underfill 208 itself can be substantially free of voids 607 of FIG. 6, such as cavities, crevices, holes, cracks, or regions absent of the underfill 208. The absence of the voids 607 prevents or eliminates cracks in the stack interconnectors 222. The underfill 208 being free of the voids 607 also reduces or eliminates cracks in the integrated circuit 202. The underfill 208 being free of the voids 607 further reduces delamination from the integrated circuit 202. The reduction or elimination of the voids 607 in the underfill 208 improves the reliability of the integrated circuit packaging system 100.

The base 206 can preferably include a routing trace 214 and a film layer 216. The routing trace 214 can be located between the first side 218 of the base 206 and a second side 220 opposite the first side 218 of the base 206.

The routing trace 214 can be formed from a conductive material such as gold, copper, aluminum, or any combination of electrically conductive material. The routing trace 214 can be used to provide connection paths within the base 206 and between the base 206 and the first side 218 or the second side 220.

The film layer 216, such as a passivation film layer or similar layer providing no conductivity, can be applied over or surround the routing trace 214 in multiple successive layers of the base 206. The film layer 216 can also include materials, such as a resistive material or a dielectric material, which can applied over or surround portions of one or more of the routing trace 214 within the base 206. The base 206 can preferably be formed of multiple layers of the film layer 216 and of the routing trace 214 resulting in improved routing density capabilities.

The film layer 216, the routing trace 214, or a combination thereof can be selectively formed or configured in the base 206 to form a passive circuit 226, such as a film resistor, a film capacitor, or a film inductor. As an example, the passive circuit 226 is shown as a portion of the base 206 with the portion of the film layer 216 and the routing trace 214 connecting two stack interconnects 222. This example can show the passive circuit 226 as a film inductor.

It has been discovered that the present invention provides the integrated circuit packaging system 100 with the capability to build integrated passive circuit, such as a film resistor, a film capacitor, or a film inductor, within the base 206 by configuring selective locations of the film layer 216, the routing trace 214, or a combination thereof. The film layer 216 can be of a resistive film layer or a dielectric film layer.

For purposes of illustration, the integrated circuit packaging system 100 is shown having the routing trace 214 formed within a single horizontal plane located in the base 206. It is understood that the integrated circuit packaging system 100 can have the routing trace 214 configured differently. For example the routing trace 214 could be distributed within several different horizontal planes, each coplanar with one another and each separated by the film layer 216. Furthermore, the routing trace 214 within a horizontal plane can have different connective path attributes from another of the routing trace 214 within a different horizontal plane.

Stack interconnectors 222, such as bump pads, pillars, stacked stud bumps, contact pads, or connective contacts having connective compatibility with the connectors 204, can be attached to the routing trace 214 adjacent the first side 218. The connectors 204 can be connected over the stack interconnectors 222 to provide connectivity between the integrated circuit 202 and the base 206. System connectors 224, such as conductive balls, columns, posts, or pins, can be coupled to the routing trace 214 from the second side 220 of the base 206 to provide connectivity between the integrated circuit packaging system 100 and a next level of integration.

Figure 3:
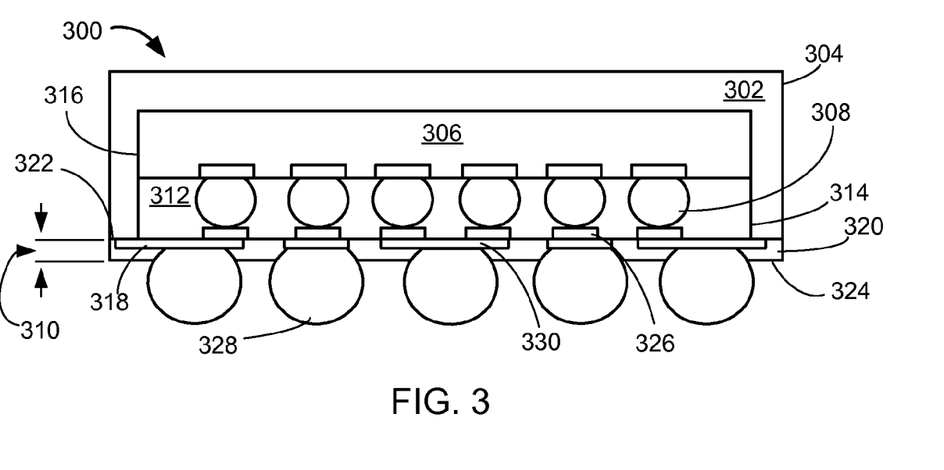
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 has structurally similarities to the integrated circuit packaging system 300 of FIG. 2.

The integrated circuit packaging system 300 can preferably include an encapsulation 302, such as an enclosure formed from an epoxy molding compound, used to protect the contents of the integrated circuit packaging system 300. The encapsulation 302 has encapsulation non-horizontal sides 304 substantially surrounding an integrated circuit 306.

The integrated circuit 306, such as a flip chip, an integrated circuit die, or integrated circuit device, with connectors 308, such as solder balls, stud bumps, copper pillars, copper bars, or combinations thereof, can preferably be mounted over a base 310.

The base 310 can be a structure formed from layers of both conductive and non-conductive materials. The base 310 can have functional characteristics similar to a printed circuit board or a package substrate but without limitations associated with the printed circuit board or the package substrate such as restrictive routing rules, finite wiring planes, and separate assembly process step. The integrated circuit 306 can be covered and surrounded with the encapsulation 302.

An underfill 312 can be formed of a material having specific coefficient of thermal expansion (CTE) characteristics and used to compensate for the thermal expansion mismatch with the integrated circuit 306, the encapsulation 302, and the base 310. The underfill 312 can preferably be between the integrated circuit 306 and the base 310 and surround the connectors 308. The underfill 312 protects the connectors 308 between the integrated circuit 306 and the base 310 from moisture or contamination and provides protection from thermal and physical related stress to the connectors 308, the integrated circuit 306, and the base 310.

Underfill non-horizontal sides 314 of the underfill 312 can be surrounded by the encapsulation 302. The underfill non-horizontal sides 314 can preferably be coplanar with edges 316 of the integrated circuit 306.

A side of the underfill 312 facing the integrated circuit 306 can be in direct physical contact with the integrated circuit 306. A side of the underfill 312 opposite the side facing the integrated circuit 306 can be in direct physical contact with the base 310. The underfill non-horizontal sides 314 and the edges 316 of the integrated circuit 306 can preferably be covered by the encapsulation 302. The underfill 312 can be substantially free of voids 1308 of FIG. 13.

The base 310 can preferably include a routing trace 318 and a film layer 320. The routing trace 318 can be formed from a conductive material such as gold, copper, aluminum, or any combination of electrically conductive material. The routing trace 318 can be used to provide connection paths within the base 310 and at a first side 322 or a second side 324 of the base 310.

The film layer 320, such as a passivation film layer or similar layer providing no conductivity, can be applied over or surround the routing trace 318 in multiple successive layers of the base 310. The film layer 320 can also include materials, such as a resistive material or a dielectric material, which can applied over or surround portions of one or more of the routing trace 318 within the base 310. The base 310 can preferably be formed of multiple layers of the film layer 320 and of the routing trace 318 resulting in improved routing density capabilities.

For purposes of illustration, the integrated circuit packaging system 300 is shown having the routing trace 318 formed within a single horizontal plane located in the base 310. It is understood that the integrated circuit packaging system 300 can have the routing trace 318 configured differently. For example the routing trace 318 could be distributed within several different horizontal planes, each coplanar with one another and each separated by the film layer 320. Furthermore, the routing trace 318 within a horizontal plane can have different connective path attributes from another of the routing trace 318 within a different horizontal plane.

The film layer 320, the routing trace 318, or a combination thereof can be selectively formed or configured in the base 310 to form a passive circuit 330, such as a film resistor, a film capacitor, or a film inductor. As an example, the passive circuit 330 is shown as a portion of the base 310 with the portion of the film layer 320 and the routing trace 318 connecting two stack interconnects 326. This example can show the passive circuit 330 as a film inductor.

Stack interconnectors 326, such as bump pads, pillars, stacked stud bumps, contact pads, or connective contacts having connective compatibility with the connectors 308, can be attached to the routing trace 318 adjacent the first side 322. The connectors 308 can be connected over the stack interconnectors 326 to provide connectivity between the integrated circuit 306 and the base 310. System connectors 328, such as conductive balls, columns, posts, or pins, can be coupled to the routing trace 318 from the second side 324 of the base 310.

Figure 4:
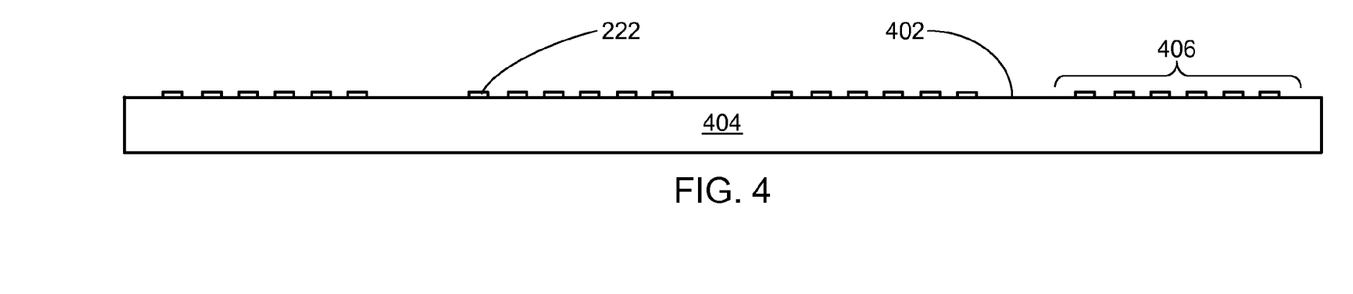
FIG. 4 is the cross-sectional view of a forming phase of a sacrificial carrier assembly for the manufacturing of the integrated circuit packaging system of FIG. 2.

Referring now to FIG. 4, therein is shown the cross-sectional view of a forming phase of a sacrificial carrier assembly for the manufacturing of the integrated circuit packaging system 100 of FIG. 2. The stack interconnectors 222 can preferably be attached or formed along an attachment side 402 of the sacrificial carrier assembly 404 at predefined locations based on the positions of the connectors 204 of FIG. 2. The sacrificial carrier assembly 404 can be a wafer, a board, a strip, or a substrate. Build sites 406, located over the sacrificial carrier assembly 404, can be used to assemble and produce the integrated circuit packaging system 100.

For purposes of illustration, four of the build sites 406 are shown. It is understood that the sacrificial carrier assembly 404 can have a different configuration. For example, the sacrificial carrier assembly 404 can be configured to support one, two, five, twelve, or any number of the build sites 406.

Furthermore, each of the build sites 406 can have different configurations of the stack interconnectors 222. For example, one of the build sites 406 can have fewer of the stack interconnectors 222 when compared with another of the build sites 406 of the sacrificial carrier assembly 404.

Figure 5:
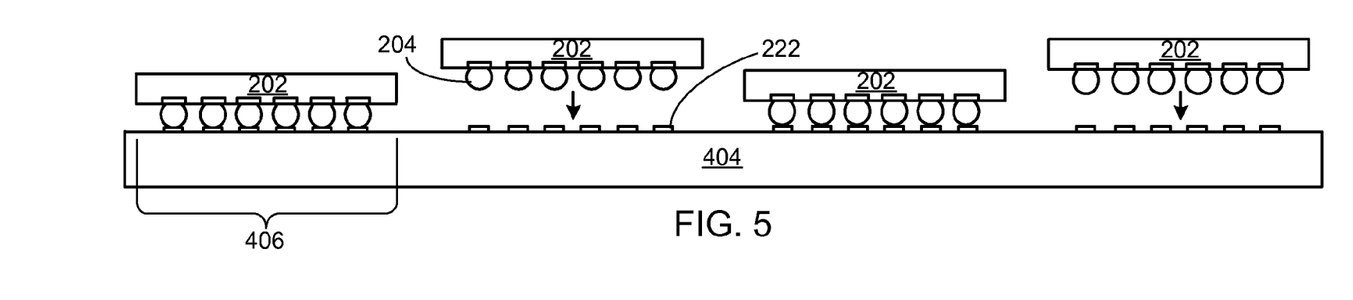
FIG. 5 is the structure of FIG. 4 in a connecting phase of the integrated circuit to the sacrificial carrier assembly.

Referring now to FIG. 5, therein is shown the structure of FIG. 4 in a connecting phase of the integrated circuit 202 to the sacrificial carrier assembly 404. The connectors 204 of the integrated circuit 202 can be located over and connected with the stack interconnectors 222. This process can optionally be replicated over any of the build sites 406 populated with the stack interconnectors 222 as needed.

For purposes of illustration, the build sites 406 are shown each being assembled with one of many previously tested good units of the integrated circuit 202. It is understood that the stack interconnectors 222 of any of the build sites 406 can be assembled and connected to components, such as active components, passive components, or combinations thereof having provisions capable of connecting with the stack interconnectors 222.

Referring now to FIG. 6, therein is shown the structure of FIG. 5 in a dispensing and curing phase of an underfill material 606. The side of the sacrificial carrier assembly 404 opposite the attachment side 402 of the sacrificial carrier assembly 404 can be vacuum mounted or mounted using a temporary adhesive onto a platform fixture 602.

While drawings of underfill material for integrated circuits generally do not show voids in the underfill, voids are a universal problem. It has been discovered that by using spin deposition or providing release paths or vents for the underfill 208, as will later be described, that the underfill 208 itself can be substantially free of the voids 607, such as cavities, crevices, holes, cracks, or regions absent of the underfill 208. This elimination of the voids 607 can be determined by the reduction or elimination of cracks in the integrated circuit 202. The underfill 208 being free of the voids 607 further reduces or eliminates delamination of the underfill 208 from the integrated circuit 202. Thus, it has been found that the reduction or elimination of the voids 607 in the underfill 208 improves the reliability of the integrated circuit packaging system 100.

The platform fixture 602 can be rotated around a central axis 604 located centrally to and perpendicular with the attachment side 402 of the sacrificial carrier assembly 404. The platform fixture 602 and the underfill material 606, such as an adhesive, an epoxy, or an encapsulant, can optionally be heated using a method such as a contact, a convective, or an infrared heating method.

The underfill material 606 can be dispensed above the central axis 604 between the build sites 406 located closest to the central axis 604. Centrifugal force from the rotation of the platform fixture 602 applied to the underfill material 606 is used to distribute the underfill material 606 horizontally along an interior area 608 of the integrated circuit 202 over each of the build sites 406.

The rate of horizontal distribution of the underfill material 606 can be controlled by the speed of rotation of the platform fixture 602. For example, increasing the speed of rotation of the platform fixture 602 will increase the rate of horizontal movement of the underfill material 606 and slowing the speed of rotation of the platform fixture 602 will decrease the horizontal movement of the underfill material 606.

The interior area 608, located between the integrated circuit 202 and the attachment side 402 of the sacrificial carrier assembly 404, having the connectors 204 and the stack interconnectors 222, can be filled with the underfill material 606 at a rate determined by the dispersal rate of the underfill material 606. For example, increasing the dispersal rate of the underfill material 606 will increase the filling rate of the underfill material 606 into the interior area 608 and decreasing the dispersal rate of the underfill material 606 will decrease the filling rate of the underfill material 606 into the interior area 608.

Varying the speed and duration of rotation of the platform fixture 602, along with the dispersal rate of the underfill material 606, applies the underfill material 606 uniformly and substantially free of the voids 607 such as cavities, crevices, holes, cracks, or regions absent of the underfill material 606. The underfill material 606 in contact with the integrated circuit 202, the conductors 204, the stack interconnectors 222, and the attachment side 402 are substantially free from the voids 607.

It has been discovered that the present invention provides the integrated circuit packaging system substantially free of voids 607 in the underfill material. Moving the underfill process with rotational application substantially eliminates the voids 607 in the underfill material between the integrated circuit and the sacrificial carrier assembly.

It has also been discovered that the present invention provides the integrated circuit packaging system with a gap 610 between the integrated circuit and the sacrificial carrier assembly 404. The elimination of the voids 607 allows the reduction of the size of the gap 610. The reduction allows for finer pitch and higher input/output density of the system connectors 308 of FIG. 3. The gap 610 can also represents the space between the integrated circuit and the base of FIG. 2.

Further, it has been discovered that the present invention provides the integrated circuit packaging system with substantially increased functionality capabilities. The capability of accommodating the conductors 204 with finer pitches and increasing the quantity of the conductors 204 results in increased functionality as a result of the gains in connectivity capabilities. Substantial improvements in functionality are most pronounced with large die sizes.

It has been found that the present invention provides the integrated circuit packaging system with improved manufacturing productivity. Moving the underfill process earlier closer to the front end of the line, as is done with the present invention, can be much more efficient and cost effective over a back end of the line underfill processing, such as waiting until the package to board integration step before proceeding with the underfill process.

The rotations of the platform fixture 602 is suspended and the underfill material 606 is allowed to settle, spread, uniformly distribute, and adhere without the voids 607 to any surface in contact with the underfill material 606 as part of the curing phase. In at least one embodiment, the underfill material 606 can include a substantially uniform distribution over the entirety of the sacrificial carrier assembly 404 or across each of the integrated circuit packaging system 100, of FIG. 1.

Figure 7:
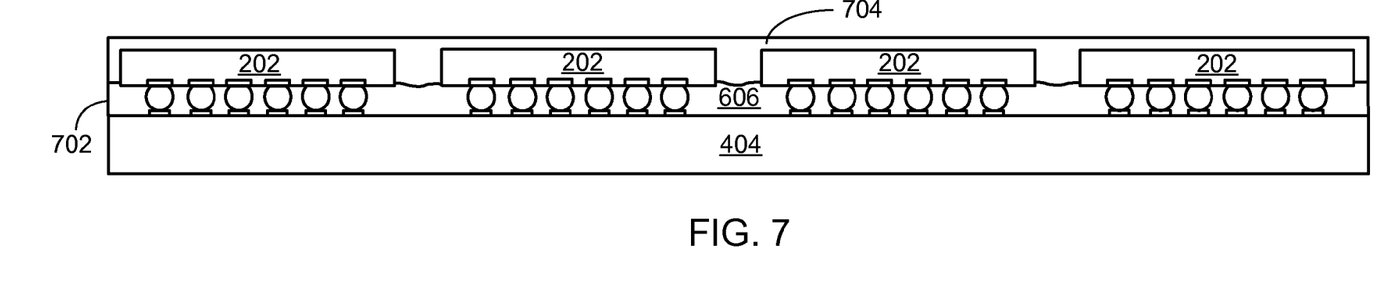
FIG. 7 is the structure of FIG. 6 in an encapsulating phase.

Referring now to FIG. 7, therein is shown the structure of FIG. 6 in an encapsulating phase. The underfill material 606 and perimeter edges 702 of the underfill material 606 can optionally be conditioned, such as with a sanding, a sawing, or a grinding process, to have any dimensions or shape that may be required of a molding fixture used during the encapsulating phase.

An encapsulant 704, such as an epoxy, silicone, or polymide based compound, can be applied over the underfill material 606 and over the integrated circuit 202 in the molding fixture (not shown). The molding fixture can be removed and the encapsulant 704 can be allowed to cure using a process such as a curing process.

Figure 8:
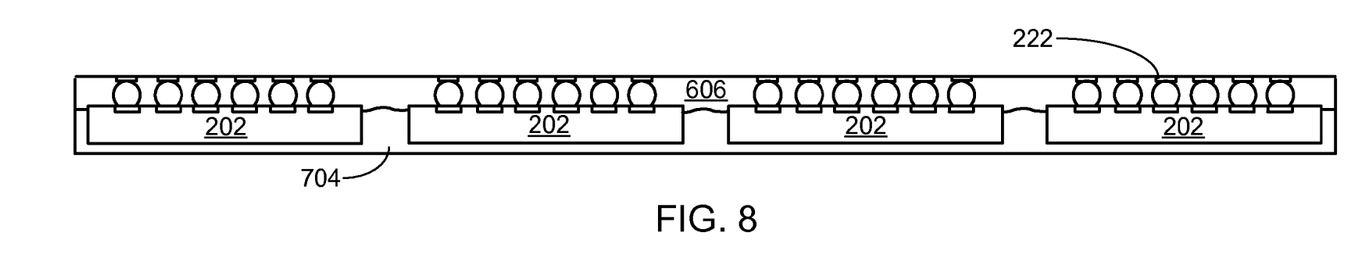
FIG. 8 is the structure of FIG. 7 in a removal phase of the sacrificial carrier assembly of FIG. 7.

Referring now to FIG. 8, therein is shown the structure of FIG. 7 in a removal phase of the sacrificial carrier assembly 404 of FIG. 7. The structure of FIG. 8 is shown inverted and without the sacrificial carrier assembly 404 of FIG. 7.

The sacrificial carrier assembly 404 was removed using a removal process, such as a grinding, a sanding, a cutting, an etching, or a mechanical peeling process, resulting in the stack interconnectors 222 substantially exposed from the underfill material 606 or the underfill material 606 formed having a substantially flat surface. The underfill material 606 and the encapsulant 704 can provide the integrated circuit 202 with the structural support previously provided using the sacrificial carrier assembly 404

Figure 9:
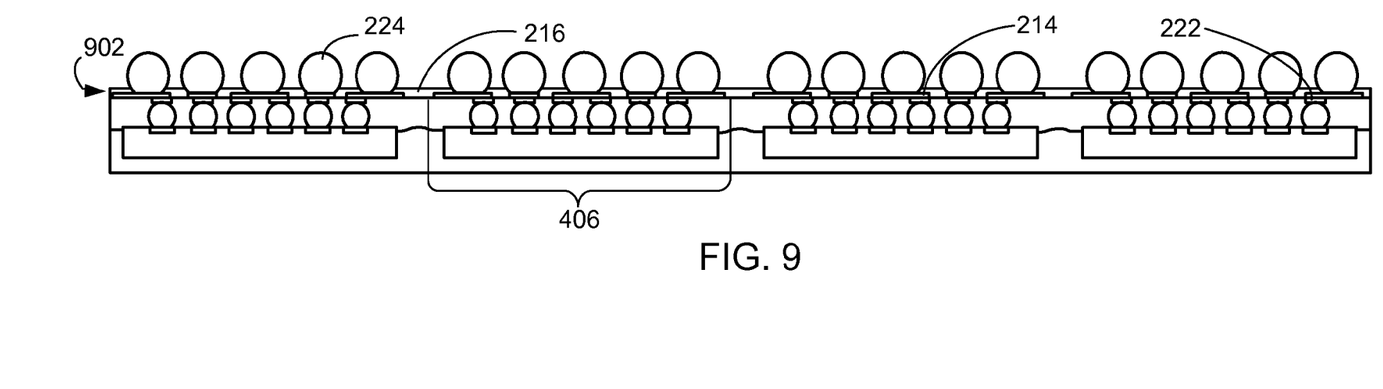
FIG. 9 is the structure of FIG. 8 in a connecting phase of the system connector.

Referring now to FIG. 9, therein is shown the structure of FIG. 8 in a connecting phase of the system connector 224. A base array 902, such as a non-laminated redistribution structure, can be formed with the routing trace 214 and the film layer 216. The routing trace 214 can preferably be layered over the stack interconnectors 222 of each of the build sites 406 with the film layer 216 formed over the routing trace 214.

Portions of the film layer 216 can optionally include resistive materials or dielectric materials which can be applied between and surround portions of one or more of the routing trace 214 of each of the build sites 406 to form isolated film resistors or isolated film capacitors. The system connectors 224 can be attached to the routing trace 214 exposed adjacent the film layer 216 of each of the build sites 406.

Figure 10:
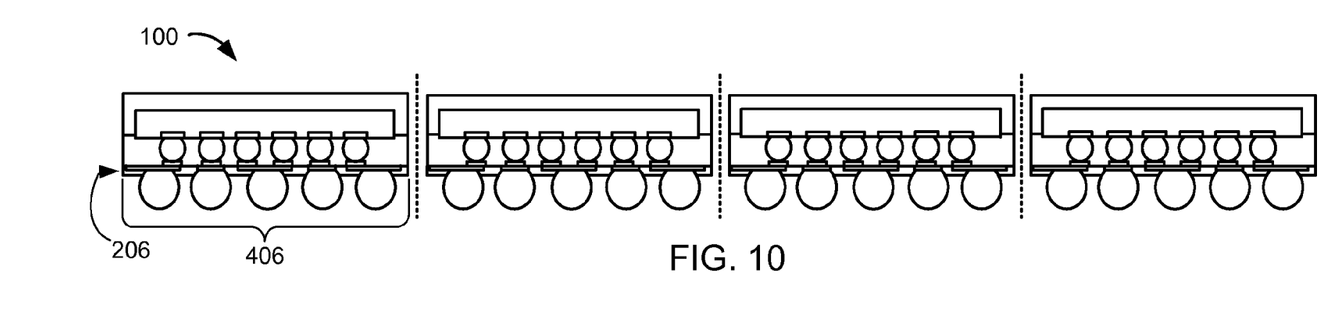
FIG. 10 is the structure of FIG. 9 in a singulating phase.

Referring now to FIG. 10, therein is shown the structure of FIG. 9 in a singulating phase. The structure of FIG. 10 is inverted relative to the structure of FIG. 9 and singulated, such as a cutting process or a sawing process, between each of the build sites 406 resulting in the formation of multiple units of the integrated circuit packaging system 100 of FIG. 2 and formation of the base 206 from the base array 902 of FIG. 9.

Figure 11:
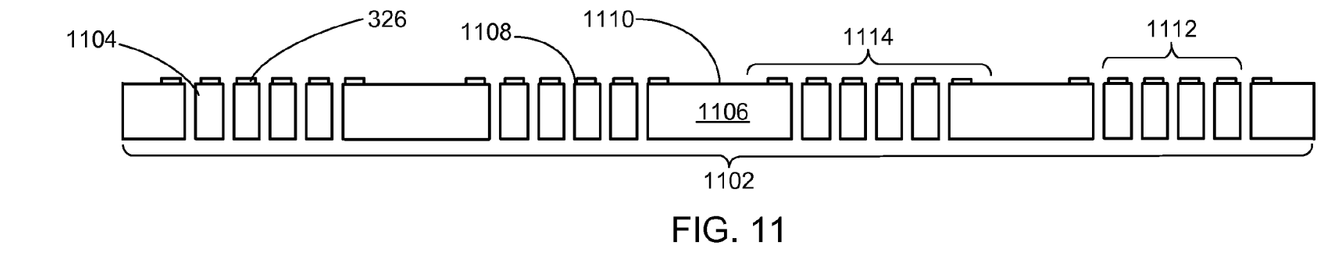
FIG. 11 is the cross-sectional view of a forming phase of a sacrificial carrier assembly for the manufacturing of the integrated circuit packaging system of FIG. 3.

Referring now to FIG. 11, therein is the cross-sectional view of a forming phase of a sacrificial carrier assembly for the manufacturing of the integrated circuit packaging system 300 of FIG. 3. The sacrificial carrier assembly 1102, such as a wafer, a board, a strip, or a substrate, can preferably include spacer sections 1104 and joiner sections 1106. Each of the spacer sections 1104 include a spacer attach side 1108 and each of the joiner sections 1106 include a joiner attach side 1110.

The spacer attach side 1108 of each of the spacer sections 1104 can be oriented within a common horizontal plane. The spacer sections 1104 can each be individually positioned adjacent one another to form a cluster group 1112. The joiner attach side 1110 of each of the joiner sections 1106 can be oriented within the common horizontal plane and each of the joiner sections 1106 can positioned adjacent and between pairs of the cluster group 1112. The spacer sections 1104 and the joiner sections 1106 of the sacrificial carrier assembly 1102 can be optionally held in their respective positions to prevent movement using a fixture (not shown), such as a vacuum platform or a mechanical jig assembly.

The stack interconnectors 326 can preferably be attached along the spacer attach side 1108. The stack interconnectors 326 can also be attached to the joiner attach side 1110 next to each end of each of the joiner sections 1106 facing an end of the cluster group 1112.

Build sites 1114, having the stack interconnectors 326 of the cluster group 1112 and the stack interconnectors 326 from ends of the joiner sections 1106 closest to the cluster group 1112, can be used to assemble and produce the integrated circuit packaging system 300.

For purposes of illustration, four of the build sites 1114 are shown. It is understood that the sacrificial carrier assembly 1102 can have a different configuration. For example, the sacrificial carrier assembly 1102 can be configured to support one, two, five, twelve, or any number of the build sites 1114. Furthermore, each of the build sites 1114 can have different configurations of the stack interconnectors 326. For example, the quantity or spacing of the spacer sections 1104 can be increased, decreased, or variable within the cluster group 1112 of any of the build sites 1114.

Figure 12:
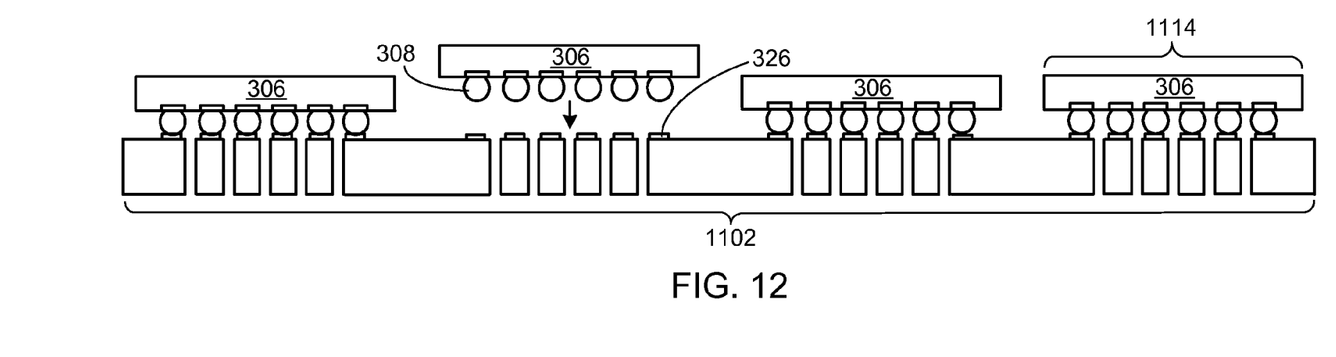
FIG. 12 is the structure of FIG. 11 in a connecting phase of the integrated circuit to the sacrificial carrier assembly.

Referring now to FIG. 12, therein is shown the structure of FIG. 11 in a connecting phase of the integrated circuit to the sacrificial carrier assembly 1102. The connectors 308 of the integrated circuit 306 can be located over and connected with the stack interconnectors 326. This process can optionally be replicated over any of the build sites 1114 populated with the stack interconnectors 326 as needed.

For purposes of illustration, the build sites 1114 are shown each being assembled with one of many previously tested good units of the integrated circuit 306. It is understood that the stack interconnectors 326 of any of the build sites 1114 can be assembled and connected to components, such as active components, passive components, or combinations thereof, having provisions capable of connecting with the stack interconnectors 326.

Figure 13:
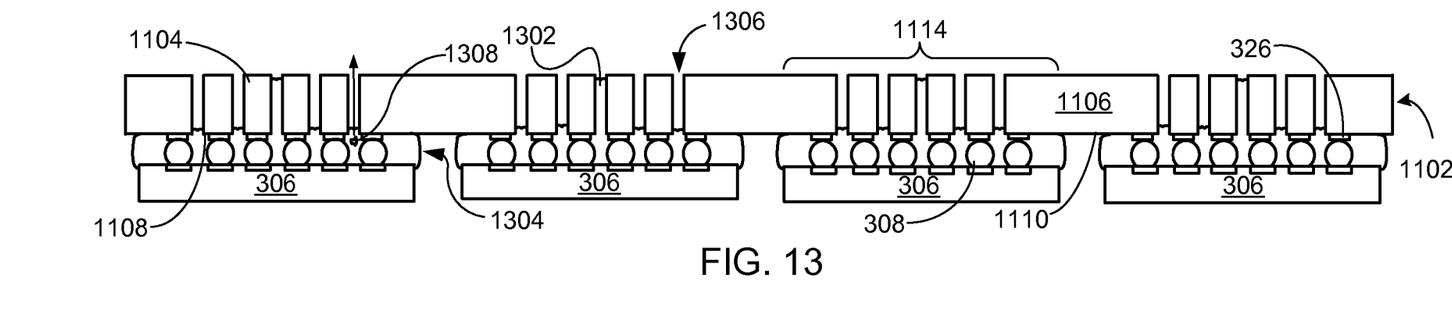
FIG. 13 is the structure of FIG. 12 a dispensing and curing phase of an underfill material.

Referring now to FIG. 13, therein is shown the structure of FIG. 12 a dispensing and curing phase of an underfill material 1302. The structure of FIG. 13 is inverted from the orientation shown in FIG. 12 and the build sites 1114 and the underfill material 1302, such as an adhesive, an epoxy, or an encapsulant, can optionally be heated using a method such as a contact, a convective, or an infrared heating method.

At each of the build sites 1114, the underfill material 1302 can be dispensed either between two of the spacer sections 1104 directly facing one another or between one of the spacer sections 1104 directly facing the joiner sections 1106. The underfill material 1302 can be applied from the sides of the spacer sections 1104 and the joiner sections 1106 opposite the sides facing the integrated circuit 306. The dispensing of the underfill material 1302 can be performed simultaneously over several of the build sites 1114 to reduce manufacturing assembly time.

The underfill material 1302 can be applied over the sacrificial carrier assembly 1102 to each of the build sites 1114, to accumulate, and to fill an interior area 1304 of the integrated circuit 306. The interior area 1304 is dimensionally bounded horizontally by a perimeter defined by spread of each of the build sites 1114 and bounded vertically by the integrated circuit 306 and the spacer attach side 1108 and the joiner attach side 1110 of the each of the build sites 1114.

Non-dispensed areas 1306, such as between the spacer sections 1104 and between the spacer sections 1104 facing the joiner sections 1106, not used to dispense the underfill material 1302 into, can serve as release paths, such as an air releasing vent, an overflow for the underfill material 1302, or as a port for a negative pressure source.

The non-dispensed areas 1306 can ensure an application of the underfill material 1302 surrounds the conductors 308 and the stack interconnectors 326. The application of the underfill material 1302 results in substantially none of the voids 1308 within the underfill material 1302 and results in the underfill material 1302 in contact with the integrated circuit 306, the spacer attach side 1108, the joiner attach side 1110, the conductors 308, and the stack interconnectors 326 to be free from any of the voids 1308.

The underfill material 1302 is allowed to settle, spread, uniformly distribute, and adhere without the voids 1308 to any surface in contact with the underfill material 1302 as part of the curing phase.

Figure 14:
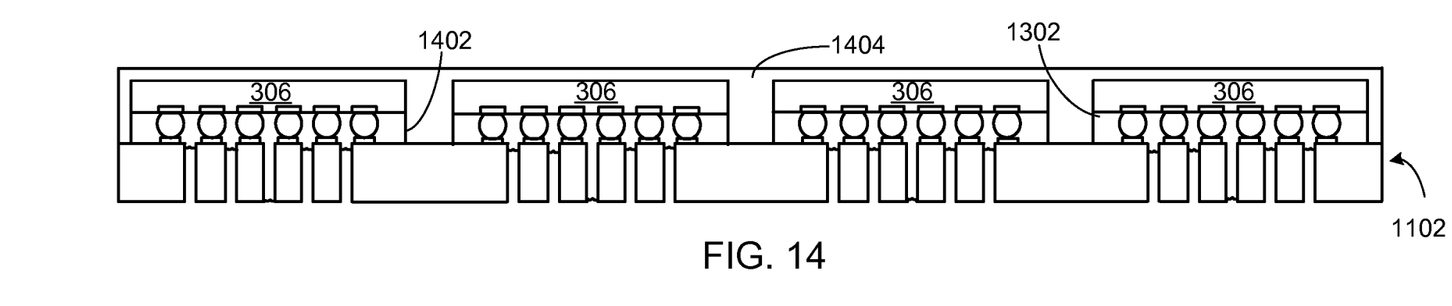
FIG. 14 is the structure of FIG. 13 in an encapsulating phase.

Referring now to FIG. 14, therein is shown the structure of FIG. 13 in an encapsulating phase. The structure of FIG. 13 is inverted and perimeter edges 1402 of the underfill material 1302 can optionally be conditioned, such as with a sanding, a sawing, etching, or a grinding process, to have any dimensions or shape that may be required of a molding fixture used during the encapsulating phase.

An encapsulant 1404, such as an epoxy, silicone, or polymide based compound, can be applied over the integrated circuit 306 in the molding fixture and surround the perimeter edges 1402. The molding fixture can be removed and the encapsulant 1404 can be allowed to cure using a process such as a curing process.

Figure 15:
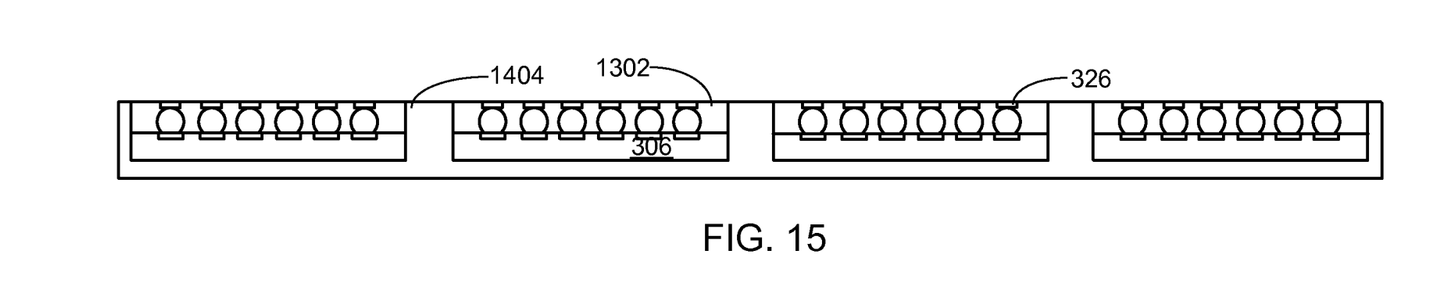
FIG. 15 is the structure of FIG. 14 in a removal phase of the sacrificial carrier assembly of FIG. 14.

Referring now to FIG. 15, therein is shown the structure of FIG. 14 in a removal phase of the sacrificial carrier assembly 1102 of FIG. 14. The structure of FIG. 14 is shown inverted and without the sacrificial carrier assembly 1102. The sacrificial carrier assembly 1102 can be removed using a removal process such as a grinding, a sanding, a cutting, or an etching process, resulting in the stack interconnectors 326 substantially exposed of from the underfill material 1302. The underfill material 1302 and the encapsulant 1404 can provide the integrated circuit 306 with the structural support previously provided using the sacrificial carrier assembly 1102.

Figure 16:
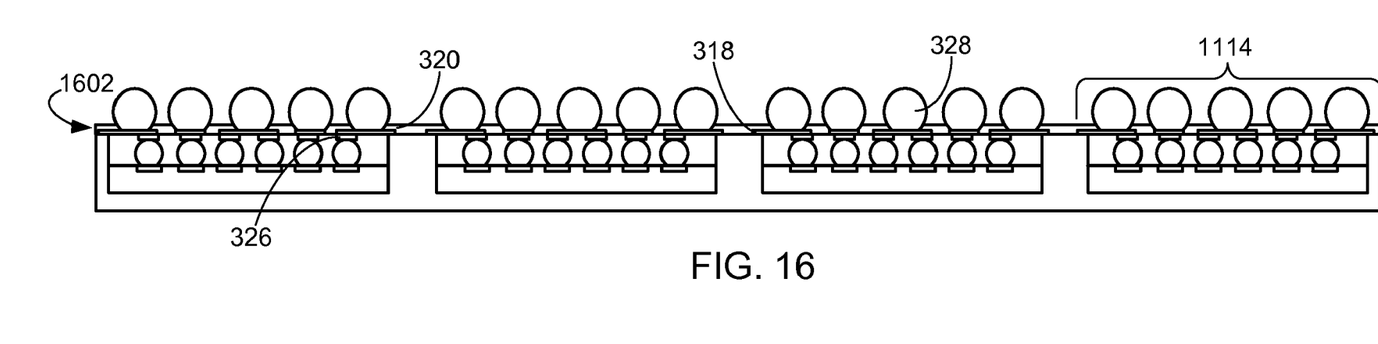
FIG. 16 is the structure of FIG. 15 in a connecting phase of the system connector.

Referring now to FIG. 16, therein is shown the structure of FIG. 15 in a connecting phase of the system connector 328. A base array 1602, such as a non-laminated redistribution structure, can be formed using the routing trace 318 and the film layer 320. The routing trace 318 can preferably be layered over the stack interconnectors 326 of each of the build sites 1114 with the film layer 320 formed over the routing trace 318.

Portions of the film layer 320 can optionally be include resistive materials or dielectric materials which can be applied between and surround portions of one or more of the routing trace 318 of each of the build sites 1114 to form isolated film resistors or isolated film capacitors. The system connectors 328 can be attached to the routing trace 318 exposed adjacent the film layer 320 of each of the build sites 1114.

Figure 17:
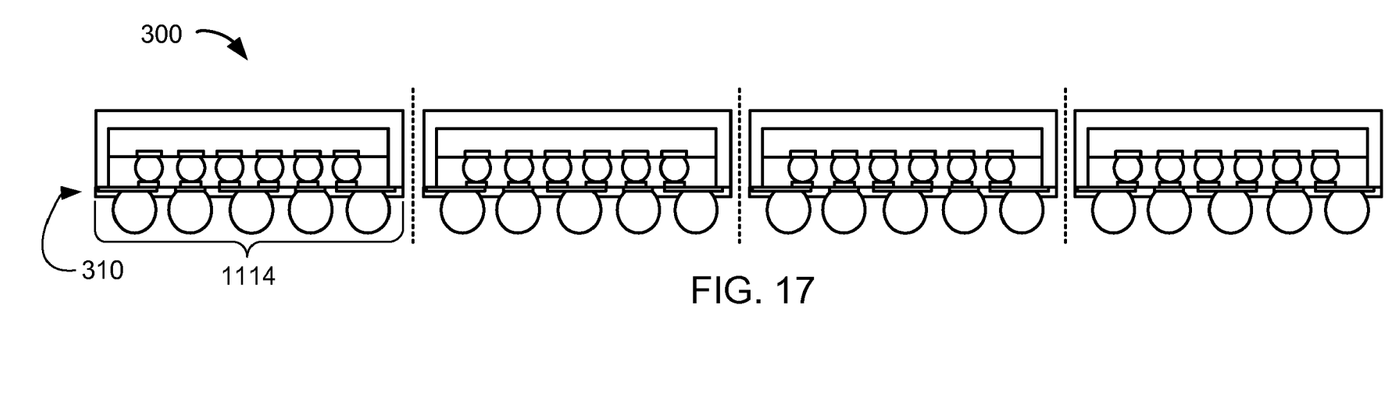
FIG. 17 is the structure of FIG. 16 in a singulating phase.

Referring now to FIG. 17, therein is shown the structure of FIG. 16 in a singulating phase. The structure of FIG. 16 is inverted and singulated using a process such as a cutting process or a sawing process, between each of the build sites 1114 resulting in the formation of multiple units of the integrated circuit packaging system 300 and formation of the base 310 from the base array 1602 of FIG. 12.

Figure 18:
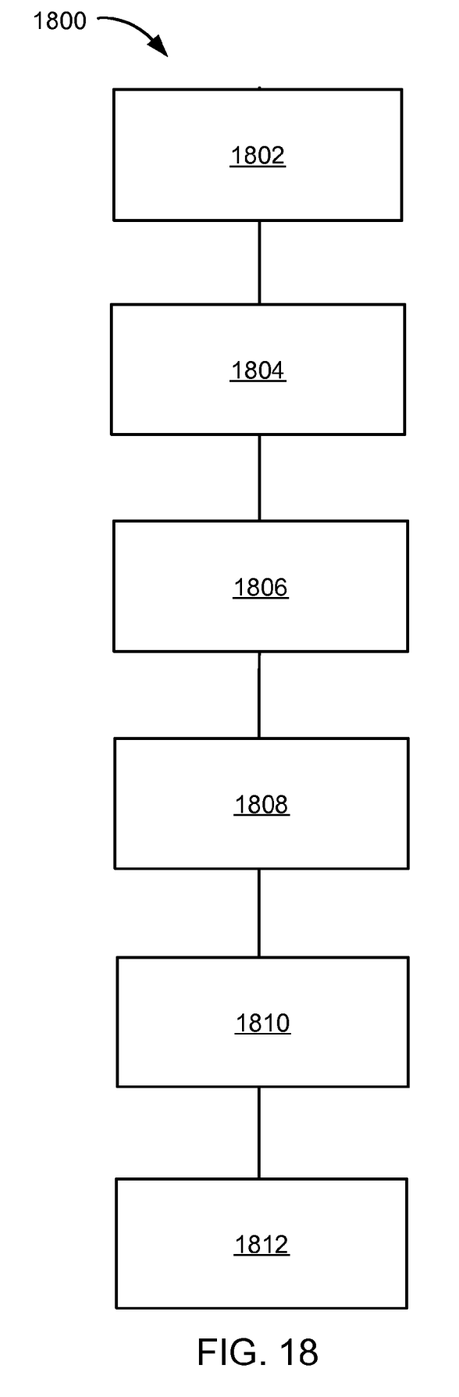
FIG. 18 is a flow chart of a method of manufacture of an integrated circuit packaging system in a further embodiment of the present invention.

Referring now to FIG. 18, therein is shown a flow chart of a method 1800 of manufacture of an integrated circuit packaging system 100 in a further embodiment of the present invention. The method 1800 includes providing a sacrificial carrier assembly having a stack interconnector thereover in a block 1802; mounting an integrated circuit having a connector over the sacrificial carrier assembly with the connector over the stack interconnector in a block 1804; dispensing an underfill material between the sacrificial carrier assembly and the integrated circuit with the underfill material substantially free of a void in a block 1806; encapsulating the integrated circuit over the sacrificial carrier assembly and the underfill material in a block 1808; exposing the stack interconnector by removing the sacrificial carrier assembly in a block 1810; and forming a base array over the underfill material and the stack interconnector in a block 1812.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package on package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
a stack interconnector;
an integrated circuit having a connector over the stack interconnector;
a base, having a first side and a second side, attached to the stack interconnector with the first side facing the stack interconnector and including a resistive circuit;
an underfill substantially free of a void between the base and the integrated circuit, the underfill entirely over the first side and including a uniform distribution;
an encapsulation over the integrated circuit, the encapsulation being of a different material than the underfill; and
a system interconnector attached to the second side.

2. The system as claimed in claim 1 wherein the encapsulation surrounds the integrated circuit and the underfill.

3. The system as claimed in claim 1 wherein the encapsulation exposes the underfill.

4. The system as claimed in claim 1 wherein the underfill substantially free of the void between the base and the integrated circuit includes the underfill having at least a portion of the integrated circuit therein.

5. The system as claimed in claim 1 wherein the underfill surrounds the connector.

6. The system as claimed in claim 1 wherein:
the base includes a routing trace between the first side and the second side;
the underfill surrounds the connector; and
the encapsulation is over the first side.

7. The system as claimed in claim 6 wherein:
the underfill includes an underfill non-horizontal side; and
the encapsulation includes an encapsulation non-horizontal side coplanar with the underfill non-horizontal side.

8. The system as claimed in claim 6 wherein the underfill prevents delamination of the integrated circuit.

9. The system as claimed in claim 6 wherein the integrated circuit having the connector over the stack interconnector includes a flip chip over the stack interconnector.

* * * * *